United States Patent
Lin et al.

(10) Patent No.: US 8,900,922 B2
(45) Date of Patent: Dec. 2, 2014

(54) FINE-PITCH PACKAGE-ON-PACKAGE STRUCTURES AND METHODS FOR FORMING THE SAME

(75) Inventors: Cheng-Chung Lin, Taipei (TW);
Kuei-Wei Huang, Hsin-Chu (TW);
Ai-Tee Ang, Hsin-Chu (TW);
Tsai-Tsung Tsai, Taoyuan (TW);
Ming-Da Cheng, Jhubei (TW);
Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/398,568

(22) Filed: Feb. 16, 2012

(65) Prior Publication Data
US 2013/0214431 A1    Aug. 22, 2013

(51) Int. Cl.
*H01L 25/07* (2006.01)

(52) U.S. Cl.
USPC .......... 438/109; 257/690; 257/778; 257/737; 257/377; 257/E23.01

(58) Field of Classification Search
USPC ................................. 438/109, 51, 52, 15, 64
See application file for complete search history.

(56) References Cited

U.S. PATENT DOCUMENTS

| | | | |
|---|---|---|---|
| 4,811,082 A | 3/1989 | Jacobs et al. |
| 4,990,462 A | 2/1991 | Sliwa, Jr. |
| 5,075,253 A | 12/1991 | Sliwa, Jr. |
| 5,380,681 A | 1/1995 | Hsu |
| 5,481,133 A | 1/1996 | Hsu |
| 6,002,177 A | 12/1999 | Gaynes et al. |
| 6,229,216 B1 | 5/2001 | Ma et al. |
| 6,236,115 B1 | 5/2001 | Gaynes et al. |
| 6,271,059 B1 | 8/2001 | Bertin et al. |
| 6,279,815 B1 | 8/2001 | Correia et al. |
| 6,434,016 B2 | 8/2002 | Zeng et al. |
| 6,448,661 B1 | 9/2002 | Kim et al. |
| 6,461,895 B1 | 10/2002 | Liang et al. |
| 6,562,653 B1 | 5/2003 | Ma et al. |
| 6,570,248 B1 | 5/2003 | Ahn et al. |
| 6,607,938 B2 | 8/2003 | Kwon et al. |
| 6,762,076 B2 | 7/2004 | Kim et al. |
| 6,790,748 B2 | 9/2004 | Kim et al. |
| 6,887,769 B2 | 5/2005 | Kellar et al. |
| 6,908,785 B2 | 6/2005 | Kim |
| 6,924,551 B2 | 8/2005 | Rumer et al. |
| 6,943,067 B2 | 9/2005 | Greenlaw |
| 6,946,384 B2 | 9/2005 | Kloster et al. |
| 6,975,016 B2 | 12/2005 | Kellar et al. |
| 7,037,804 B2 | 5/2006 | Kellar et al. |
| 7,056,807 B2 | 6/2006 | Kellar et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,271,482 B2 | 9/2007 | Kirby |
| 7,276,799 B2 | 10/2007 | Lee et al. |

(Continued)

*Primary Examiner* — Chuong A Luu
*Assistant Examiner* — Rodolfo Fortich
(74) *Attorney, Agent, or Firm* — Slater & Matsil, L.L.P.

(57) ABSTRACT

A method includes laminating a Non-Conductive Film (NCF) over a first package component, and bonding a second package component on the first package component. The NCF and the second package component are on a same side of the first package component. Pillars of a mold tool are then forced into the NCF to form openings in the NCF. The connectors of the first package component are exposed through the openings.

14 Claims, 19 Drawing Sheets

(56) References Cited

U.S. PATENT DOCUMENTS

| | | |
|---|---|---|
| 7,279,795 B2 | 10/2007 | Periaman et al. |
| 7,300,857 B2 | 11/2007 | Akram et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 7,989,263 B2 | 8/2011 | Kramer et al. |
| 8,361,901 B2 | 1/2013 | Vick et al. |
| 8,476,770 B2 | 7/2013 | Shao et al. |
| 8,563,438 B2 | 10/2013 | Maekawa |
| 8,685,798 B2 | 4/2014 | Shao et al. |
| 2007/0190690 A1* | 8/2007 | Chow et al. .................... 438/113 |
| 2008/0164638 A1 | 7/2008 | Zhang |
| 2010/0247698 A1 | 9/2010 | Zhang et al. |
| 2012/0025374 A1* | 2/2012 | Bae et al. ........................ 257/737 |

* cited by examiner

FINE-PITCH PACKAGE-ON-PACKAGE STRUCTURES AND METHODS FOR FORMING THE SAME

CROSS-REFERENCE TO RELATED APPLICATION

This application relates to the following commonly-assigned U.S. patent application: application Ser. No. 13/178,345, filed Jul. 7, 2011, and entitled "Apparatus and Methods for Forming Through Vias," which application is hereby incorporated herein by reference.

BACKGROUND

In a conventional Package-on-Package (POP) process, a top package is bonded to a bottom package. The top package and the bottom package may also have device dies therein. By adopting the PoP process, the integration level of the packages may be increased.

In an existing PoP process, the bottom package is formed first, which includes a device die bonded to a package substrate. A molding compound is then molded on the package substrate, wherein the device die is molded in the molding compound. The package substrate further includes solder balls formed thereon, wherein the solder balls and the device die are on a same side of the package substrate. The solder balls are used for connecting the top package to the bottom package. Accordingly, the heights of the solder balls need to be greater than the thickness of the device die, so that the top portions of the solder balls may protrude above the top surface of the device die, and above the top surface of the molding compound. Accordingly, the sizes of the solder balls are also large, and the number of the solder balls that can be used in a PoP structure is limited.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Package-on-Package (PoP) structure and the methods of forming the same are provided in accordance with various exemplary embodiments. The intermediate stages of forming the package structure are illustrated. The variations of the embodiments are discussed. Throughout the various views and illustrative embodiments, like reference numbers are used to designate like elements.

Figure 1:
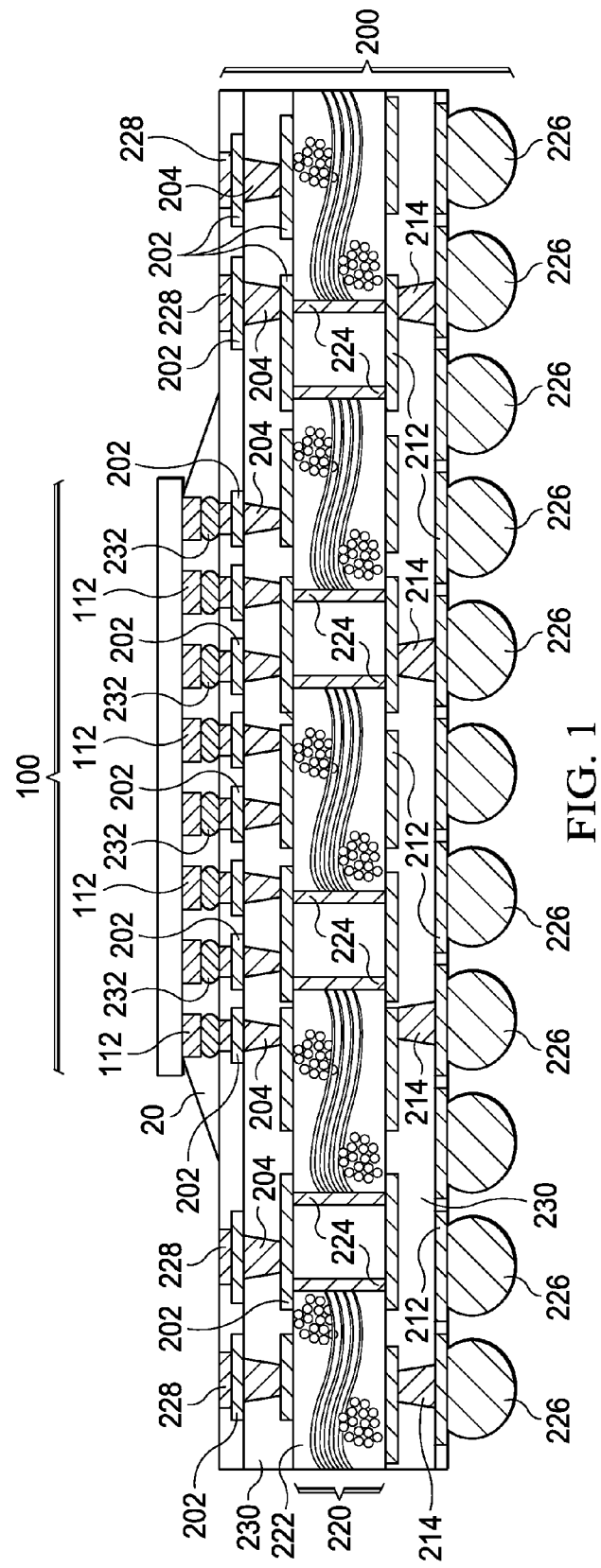
FIGS. 1 through 7 are cross-sectional views of intermediate stages in the manufacturing of a Package-on-Package (PoP) structure in accordance with some exemplary embodiments.

FIG. 1 illustrates a cross-sectional view of a package in accordance with some exemplary embodiments. The package includes package component 100 bonded to package component 200. Package component 100 may be a device die that includes active devices such as transistors (not shown) therein, although package component 100 may also be other type of package components. For example, package component 100 may be an interposer that does not have active devices therein. Package component 100 includes connectors 112. In some embodiments, connectors 112 include metal pillars, wherein solder caps may be, or may not be, formed on the metal pillars. In alternative embodiments, connectors 112 include solder balls. The metal pillars in connectors 112 may be formed of copper or a copper alloy, and may also include additional layers (not shown) such as a nickel layer, a palladium layer, a gold layer, or the like.

Package component 200 may be a package substrate in accordance with some embodiments. Alternatively, package component 200 may be another type of package components such as an interposer, for example. Package component 200 may include metal lines 202/212 and vias 204/214 for interconnecting metal features on opposite sides of package component 200. Metal lines 202 are also referred to as metal traces 202 hereinafter. In an embodiment, metal traces 202, which are formed on the topside of package component 200, are electrically coupled to connectors 226, which are on the bottom side of package component 200. The interconnection may be made through electrical connectors 224. In some exemplary embodiments, package component 200 includes core 220 that has dielectric substrate 222 and electrical connectors 224 penetrating through dielectric substrate 222. Connectors 226 may be formed on the bottom side of package component 200. Connectors 226 may be solder balls, for example. In some embodiments, dielectric substrate 222 is formed of fiber glass, although other dielectric materials may be used. Metal lines 202/212 and vias 204/214 may be formed in dielectric layers 230. It is realized that package component 200 may have various other structures. For example, package components may be formed of laminated layers, and may not include a core.

Package components 100 and 200 are bonded to each other through solder regions 232, which may be formed of a lead-free solder, a eutectic solder, or the like. Solder regions 232 are bonded to, and are in physical contact with, the top surfaces of metal traces 202, wherein the top surfaces face package component 100. After the bonding of package components 100 and 200, underfill 20 is filled into the gap between package components 100 and 200, and between connectors 112.

Package component 200 further includes connectors 228 that are exposed. Connectors 228 may be metal pads, for example. Connectors 228 and package component 100 are on the same side of package component 200.

Figure 2:
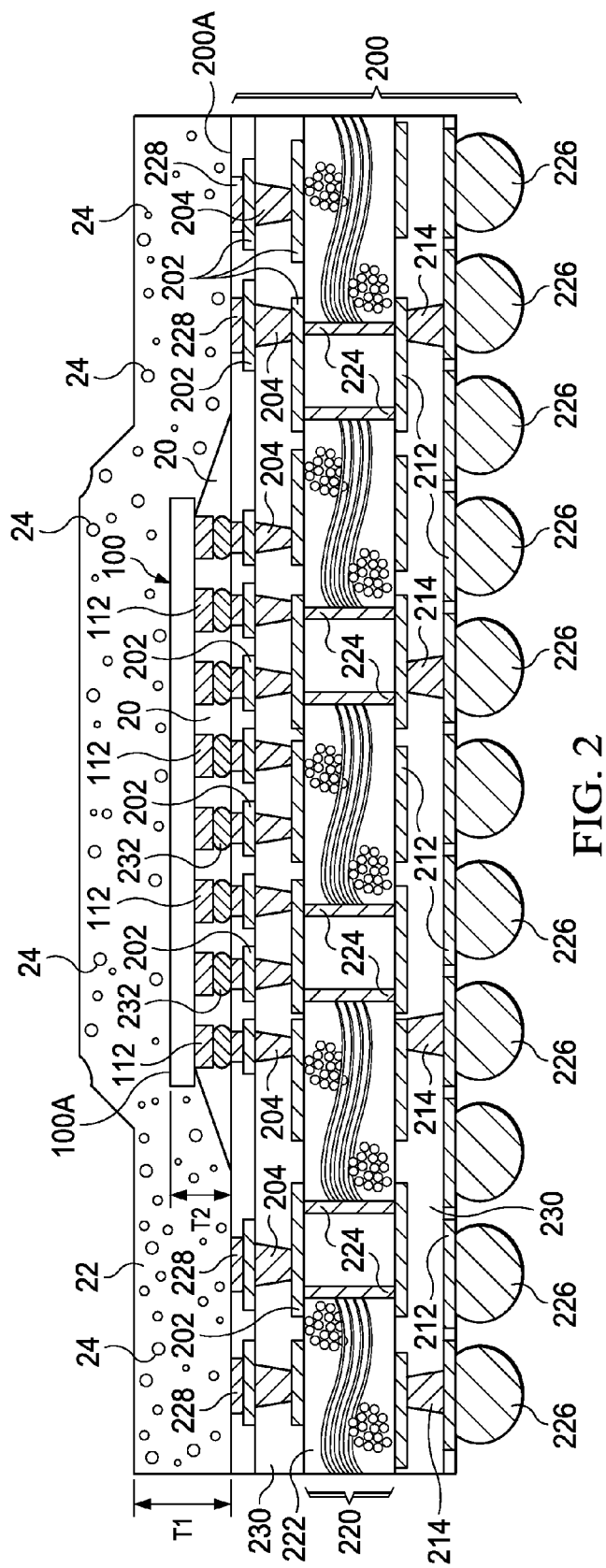

Referring to FIG. 2, Non-Conductive Film (NCF) 22, which is not conductive, is laminated onto the top surfaces of package components 100 and 200. In some embodiments, NCF 22 includes a base material, which may be a polymer. The base material may be an epoxy, a resin, or the like. Furthermore, NCF 22 may include filler 24. In some embodiments, filler 24 is a silicon filler, and hence is referred to as silicon filler 24 hereinafter, although other kinds of fillers may be used. Silicon filler 24 may be in the form of fine particles, which are mixed into the base material. Silicon filler 24 may have a volume percentage between about 40 percent and about 70, for example, of the total volume of NCF 22. By adding silicon filler 24 into NCF 22, the Coefficient of Thermal Expansion (CTE) of NCF 22 is closer to the CTE of the substrate of package component 100, which substrate may be a silicon substrate. In addition, NCF 22 may further include a solder flux for better soldering. In some exemplary embodiments, thickness T1 of NCF 22 may be substantially equal to, or greater than, distance T2 between top surface 100A of package component 100 and top surface 200A of package component 200.

Figure 3:
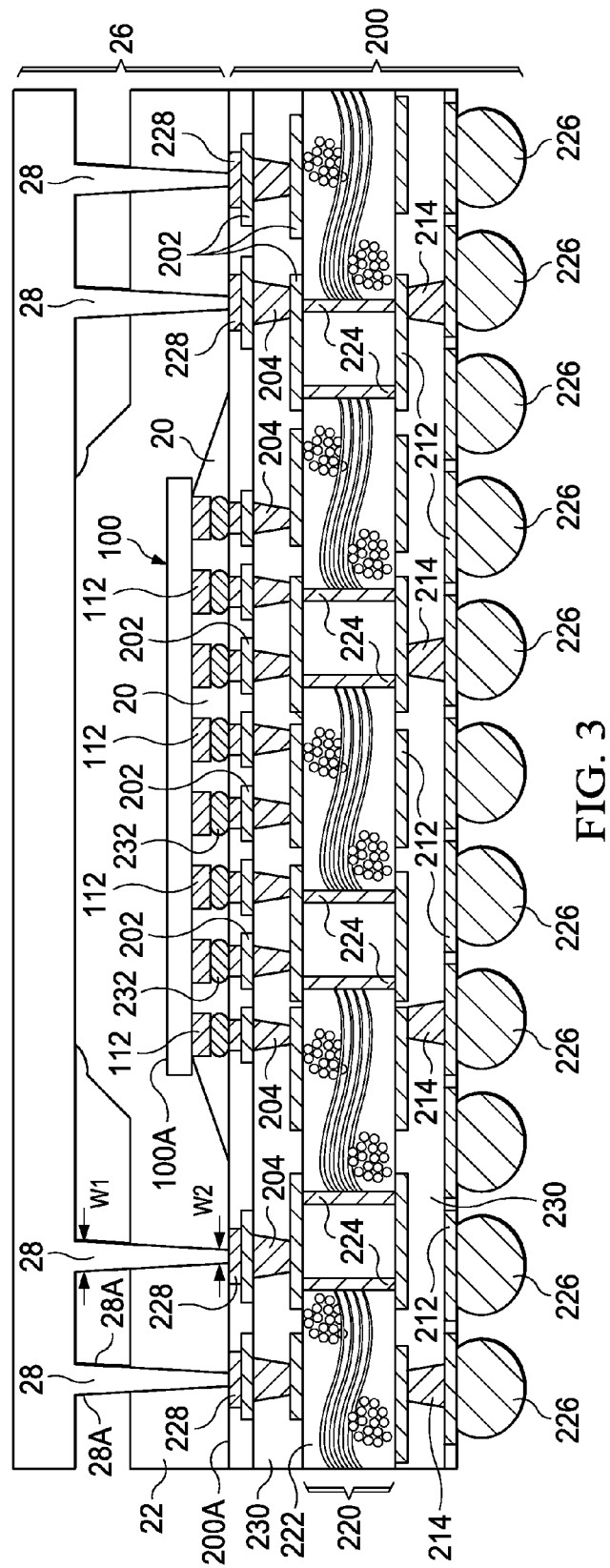

Referring to FIG. 3, mold tool 26 is provided. Mold tool 26 includes a plurality of pillars 28, wherein the bottom ends of pillars 28 are coplanar. Mold tool 26 may be made of a hard material. Furthermore, the material of mold tool 26 is suitable for forming very thin pillars 28. The material of mold tool 26 may include steel, stainless steel, ceramic, or the like. In some embodiments, pillars 28 have a vertical profile, with top width W1 being equal to bottom width W2. In alternative embodiments, pillars 28 have a tapered profile, and top width W1 is greater than bottom width W2. Side edges 28A of pillars 28 may be substantially straight or slightly curved in the cross-sectional view.

An imprinting on NCF 22 is then performed, wherein mold tool 26 is forced into NCF 22, until the bottom ends of pillars 28 are in contact with connectors 228 in package component 200. At this stage of the process, NCF 22 is not cured yet, and hence is relatively soft. Pillars 28 may thus be forced into NCF 22 without being damaged, and without damaging package component 200.

Figure 4:
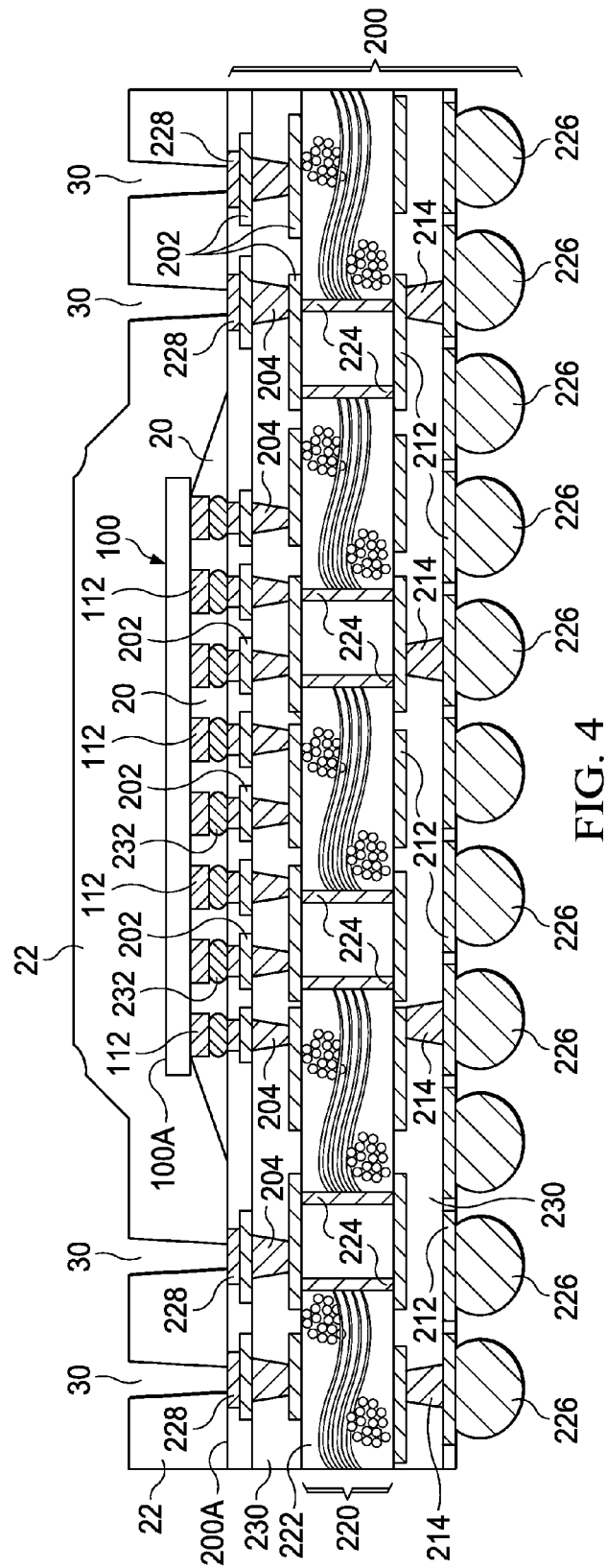

Referring to FIG. 4, mold tool 26 is taken out of NCF 22, and leaving vertical openings 30 in NCF 22. The sizes and the shapes of openings 30 are determined by the sizes and the shapes of pillars 28. Depending on the profiles of pillars 28, in some embodiments, openings 30 have straight sidewalls that are substantially vertical. In alternative embodiments, openings 30 are wider at the top and narrower at the bottom. Pillars 28 and connectors 228 may have a one-to-one correspondence, with the positions of pillars 28 accurately aligned to that of connectors 228. Accordingly, after mold tool 26 is taken away, each of metal connectors 228 is exposed through one of openings 30.

Figure 5:
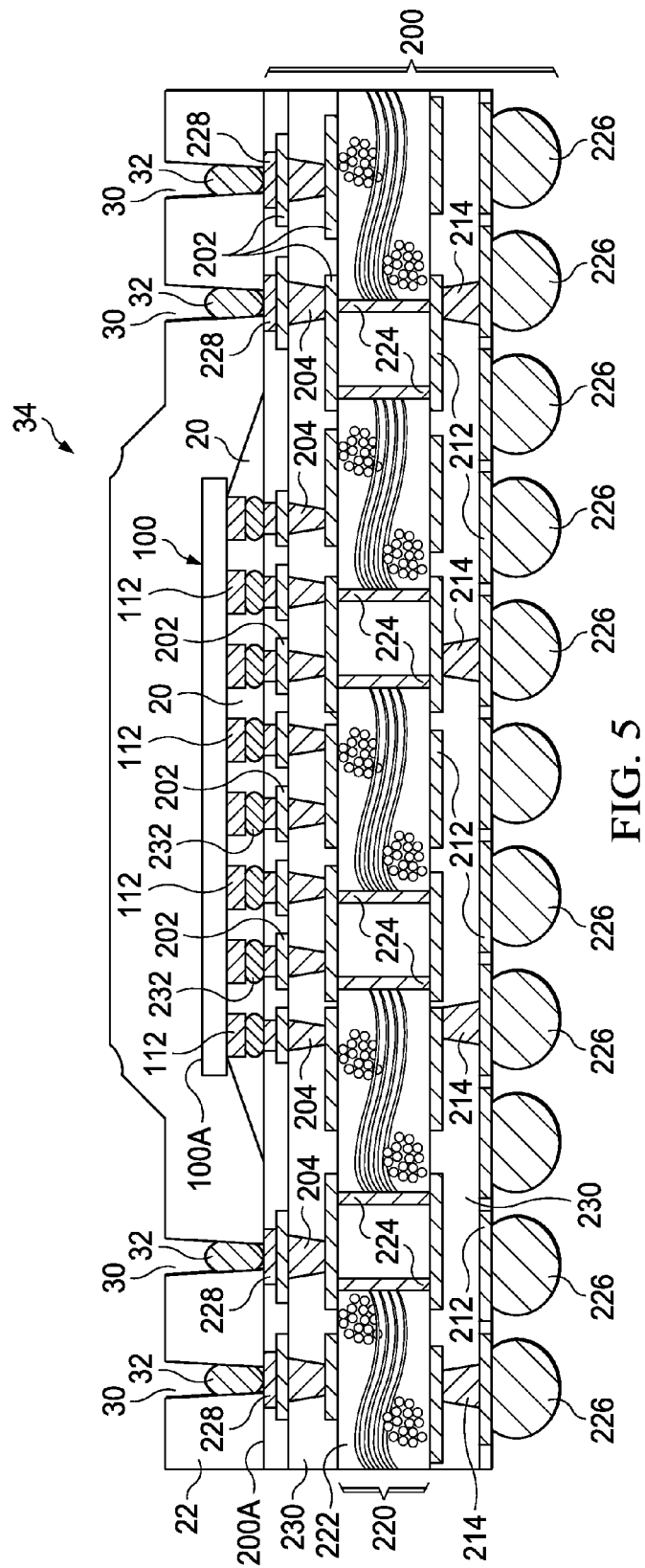
Figure 6:
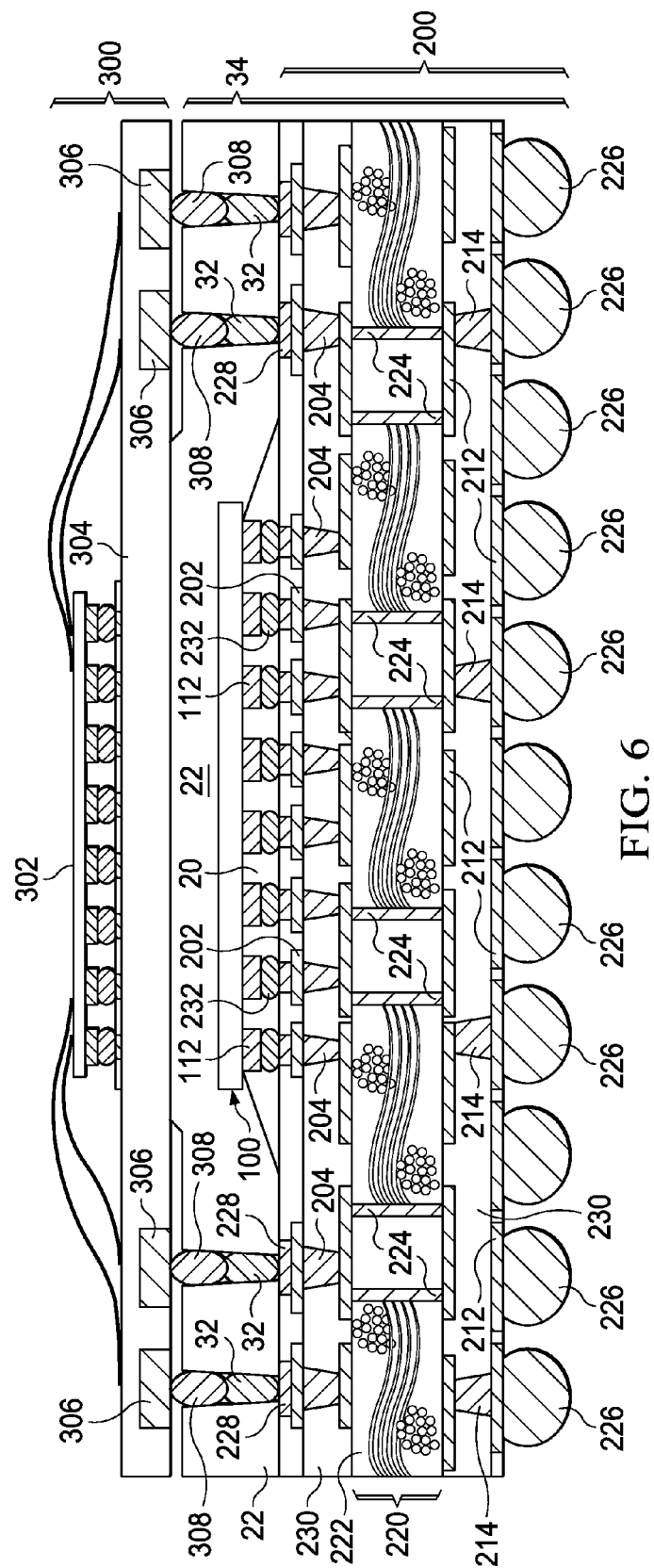

Next, referring to FIG. 5, solder balls 32 are placed into openings 30, and are then reflowed. The flux in NCF 22 helps the reflow process. Throughout the description, the structure shown in FIG. 5, which includes package components 100 and 200, are in combination referred to as bottom package 34. Top package 300 may then be placed on bottom package 34, as shown in FIG. 6. In some exemplary embodiments, top package 300 includes device die 302 bonded to package substrate 304. Top package 300 may include connectors (such as metal pads) 306 at the bottom surface, and solder regions 308 on connectors 306. When top package 300 is placed on bottom package 34, solder regions 308 are aligned to, and may be in contact with, solder balls 32. Since NCF 22 is soft, a force may be applied to slightly press NCF 22, so that NCF 22 is slightly flattened.

Figure 7:
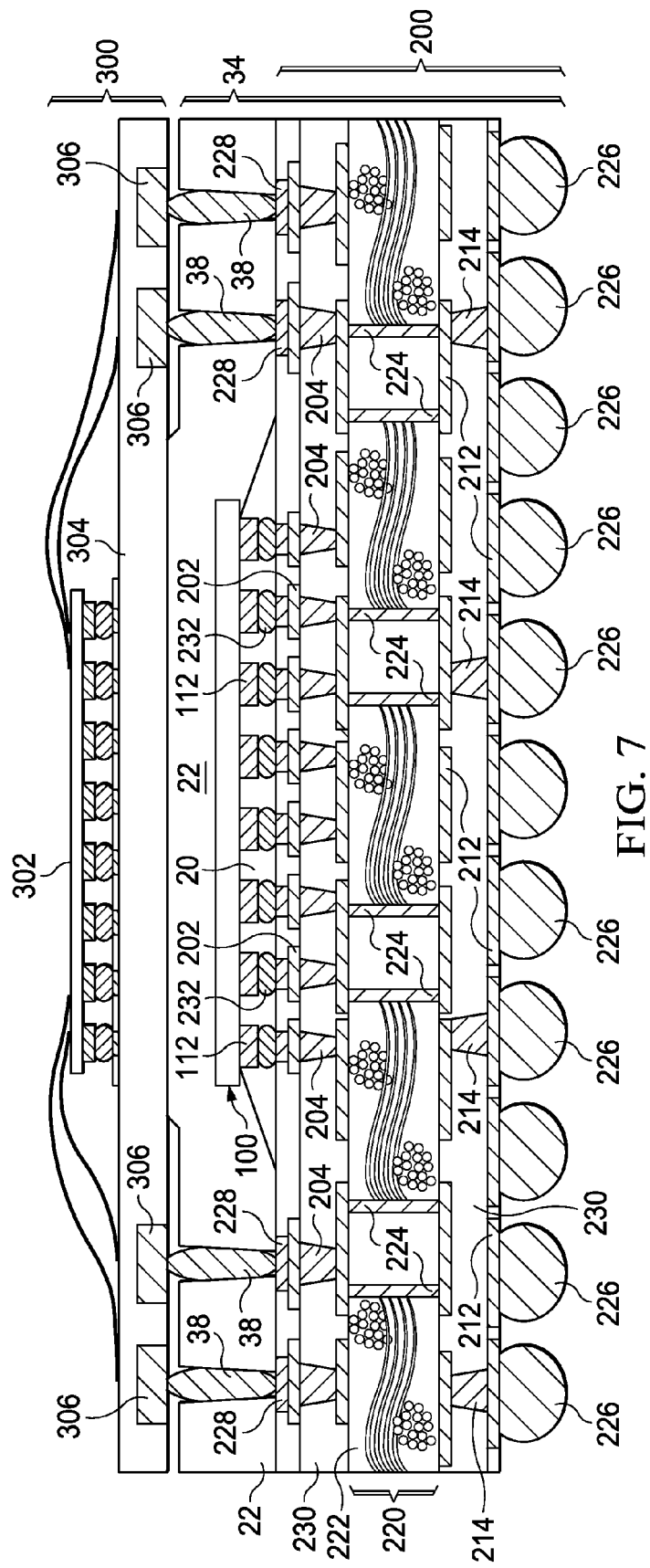

Referring to FIG. 7, a reflow is performed to reflow solder regions 308 and 32, so that solder regions 38 are formed. The flux in NCF 22 helps the reflow of solder region 308 and 32. Solder regions 38 bond top package 300 to bottom package. A curing process is also performed to cure NCF 22.

FIGS. 8 through 13 illustrate cross-sectional views of intermediate stages in the fotination of a PoP structure in accordance with alternative exemplary embodiments. Unless specified otherwise, the materials and the formation methods of the components in these embodiments are essentially the same as the like components, which are denoted by like reference numerals in the embodiment shown in FIGS. 1 through 7. The formation details of the embodiments shown in FIGS. 8 through 13 (and the embodiments shown in FIGS. 14 through 20) may thus be found in the discussion of the embodiments shown in FIGS. 1 through 7.

Figure 8:
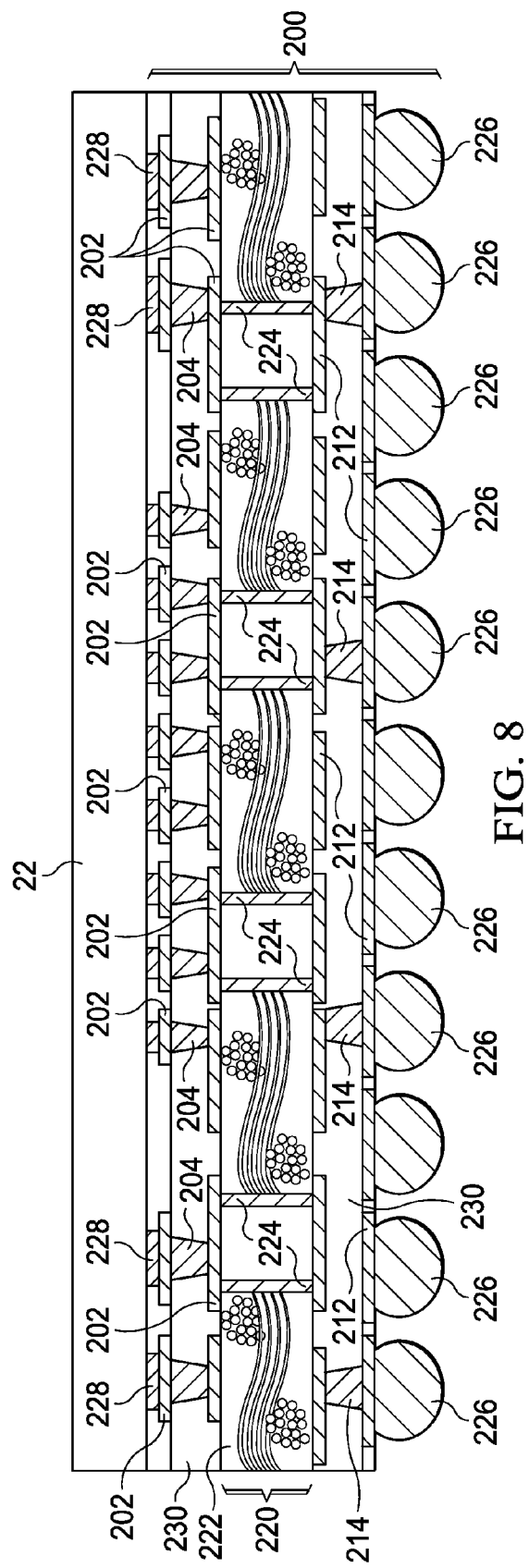
FIG. 8 through 20 are cross-sectional views of intermediate stages in the manufacturing of PoP structures in accordance with alternative embodiments.
Figure 9:
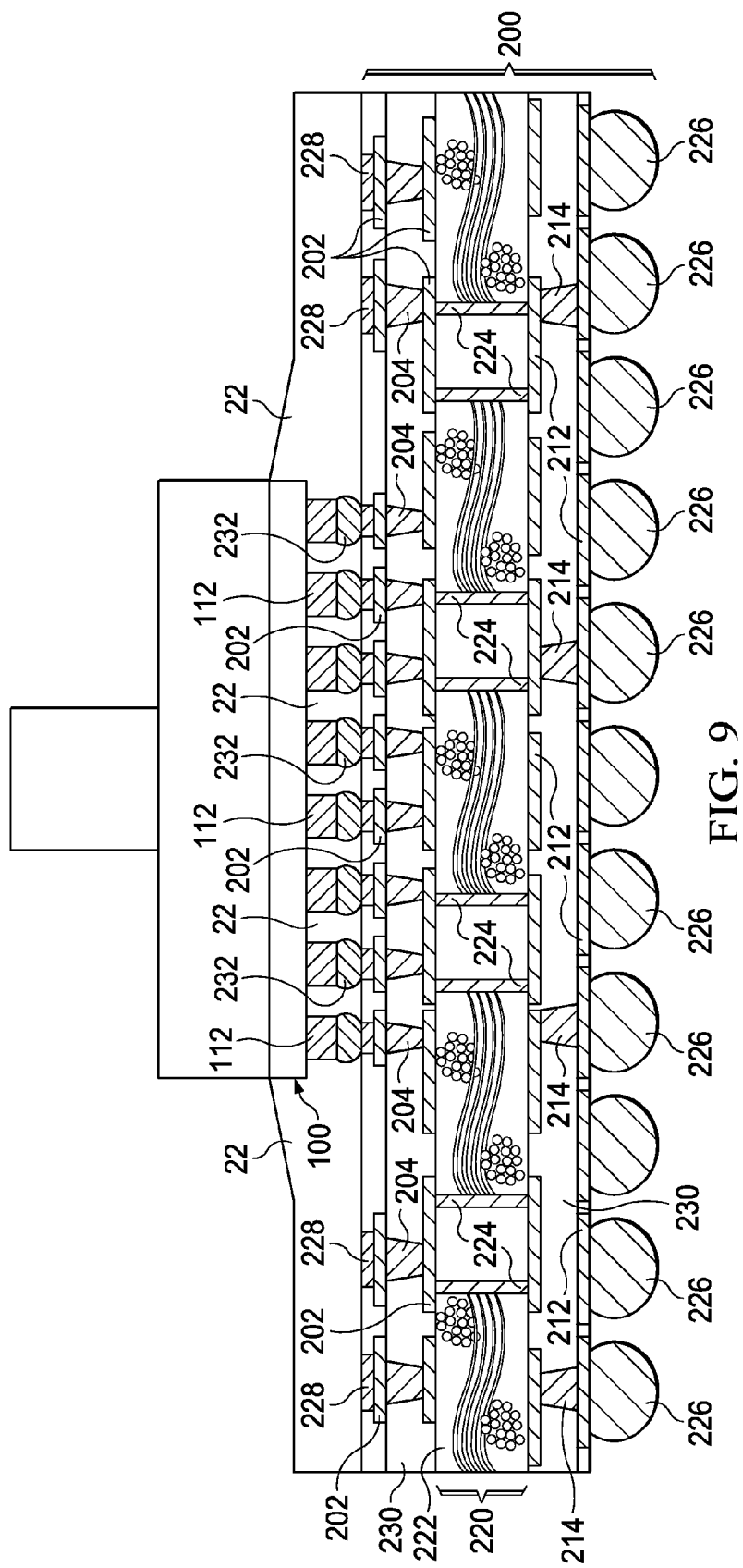

Referring to FIG. 8, package component 200 is provided. NCF 22 is laminated on package component 200. The size (viewed in the top view) and the top-view shape of NCF 22 may substantially match the size and the top-view shape of package component 200. NCF 22 is not cured at this stage, at least fully. Next, as shown in FIG. 9, package component 100 is bonded to package component 200, for example, using Thermal Compress Bonding (TCB). During the bonding process, connectors 112 are forced down to penetrate through NCF 22, and are in contact with the connectors on the top surface of package component 200. A reflow may then be performed to bond package components 100 and 200 together. In the resulting structure, NCF 22 does not include any portion on the top surface of package component 100.

Figure 10:
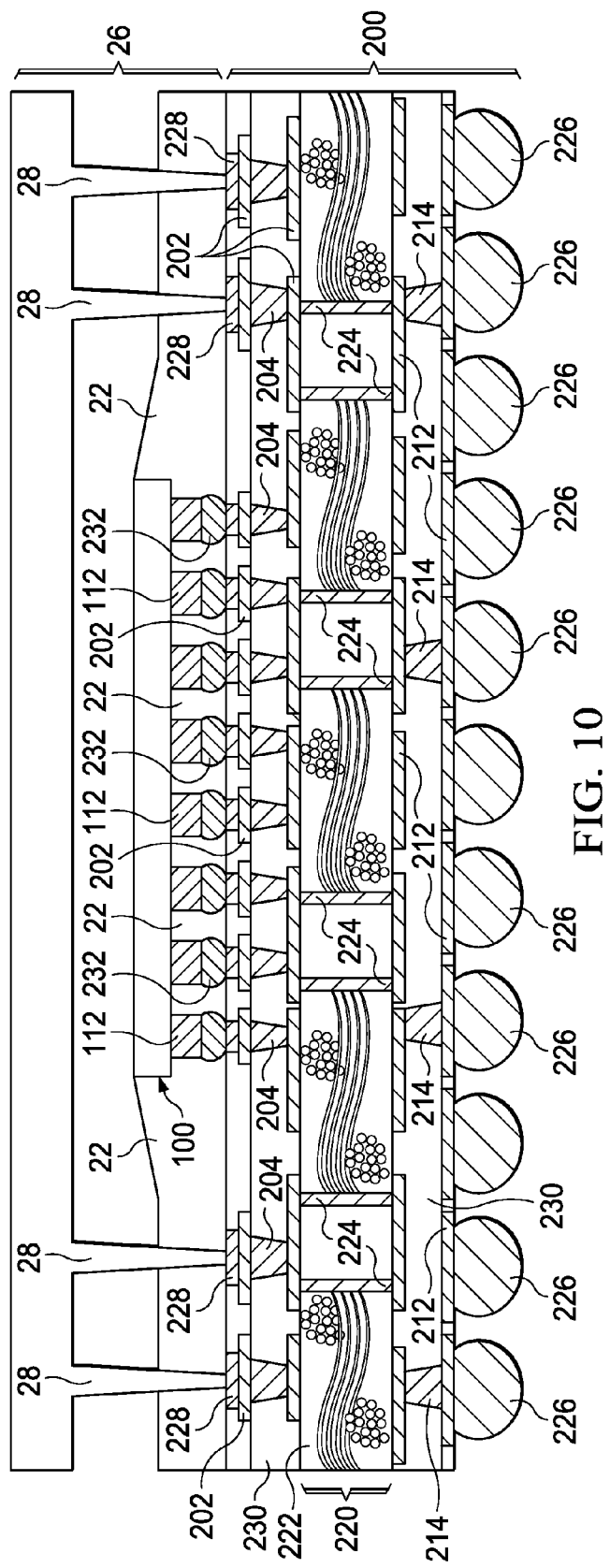
Figure 11:
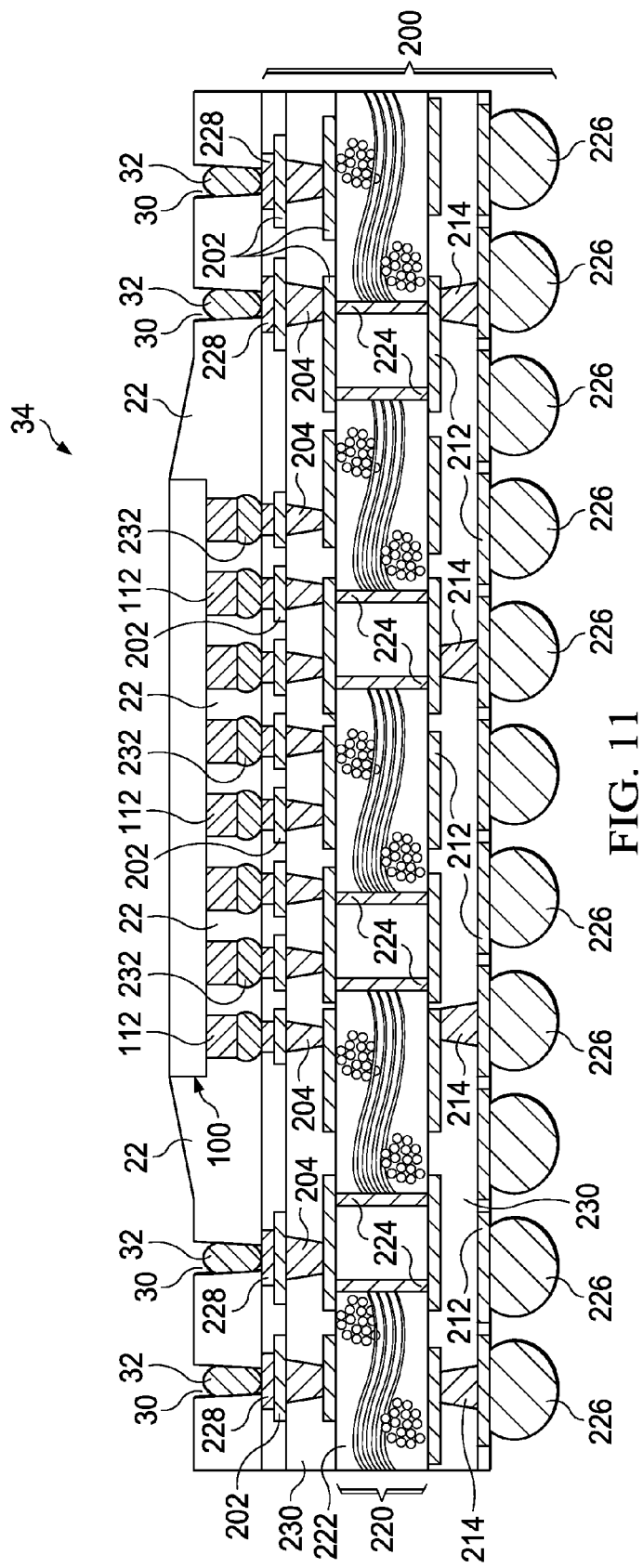

Next, as shown in FIG. 10, an imprint is made by forcing pillars 28 of mold tool 26 into NCF 22. As a result, as shown in FIG. 11, openings 30 are formed, and connectors 228 are exposed through openings 30. As further illustrated in FIG. 11, solder balls 32 are placed into openings 30, and are reflowed. Bottom package 34 is thus formed.

Figure 12:
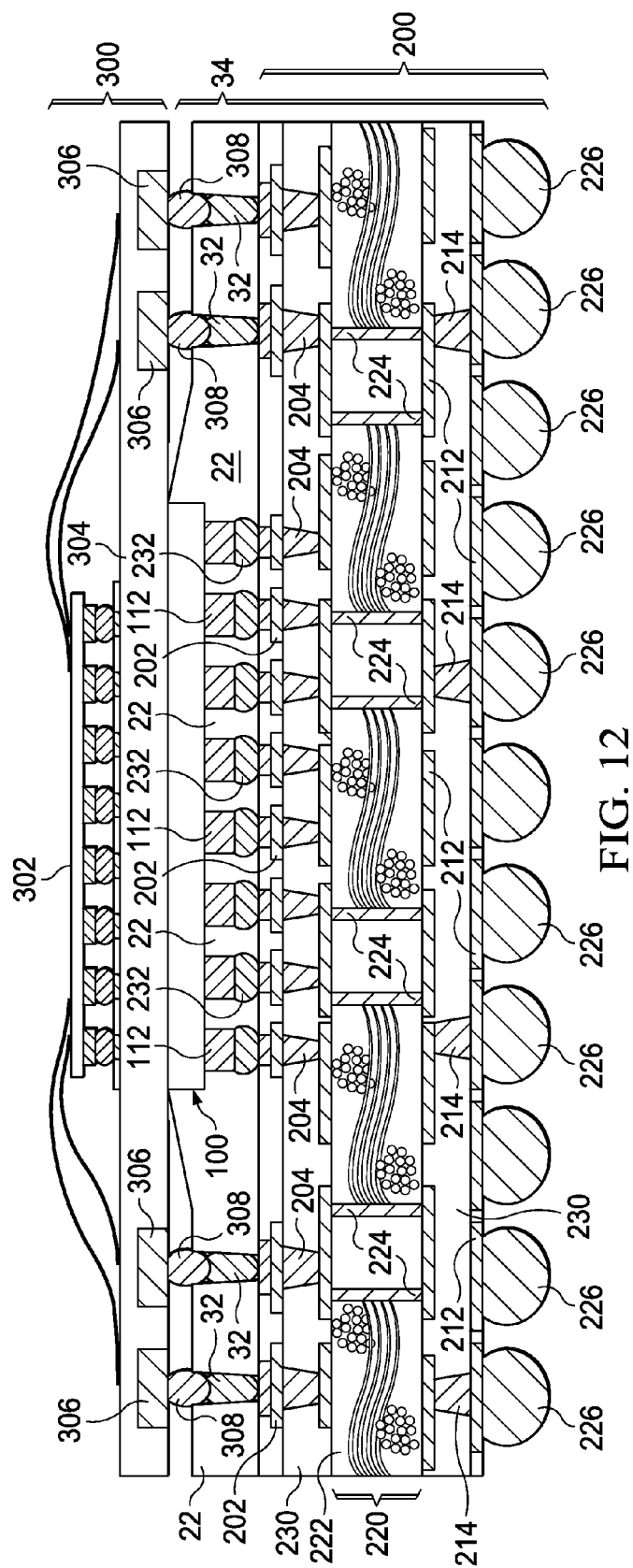
Figure 13:
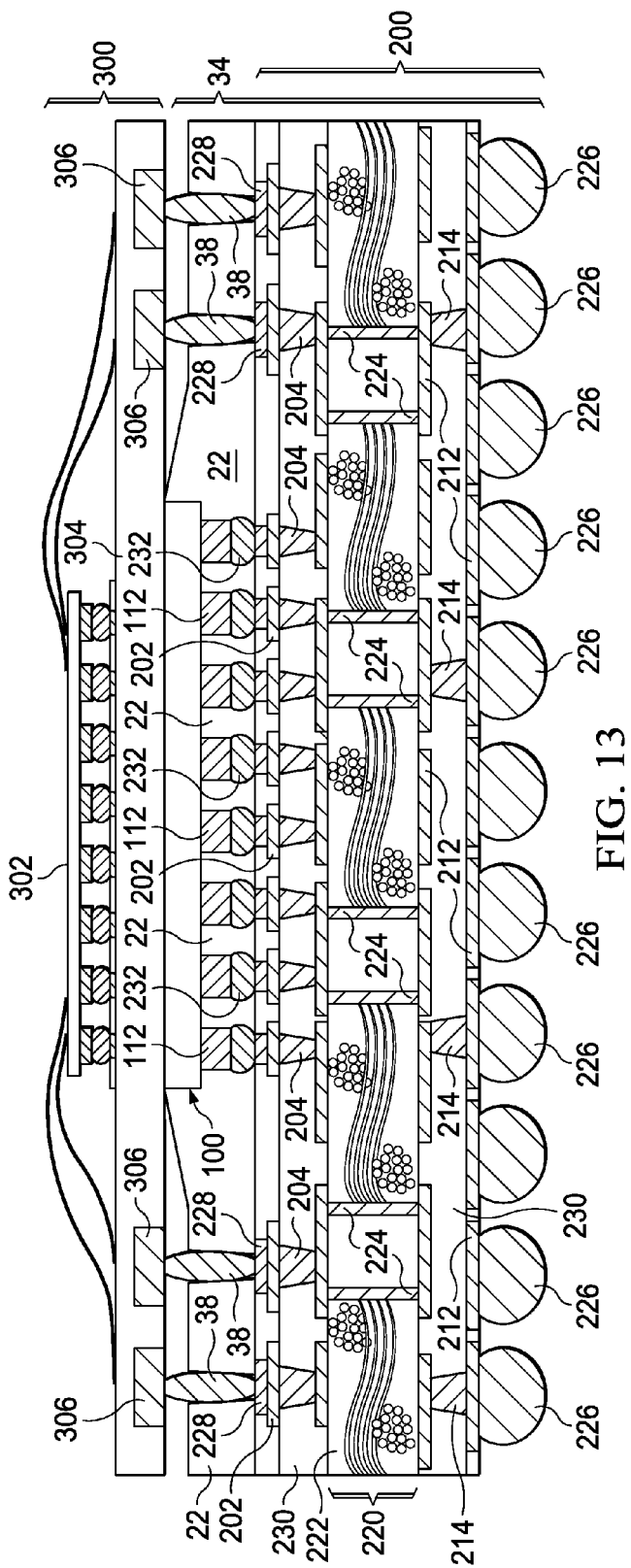

FIGS. 12 and 13 illustrate the bonding of top package 300 onto bottom package 34. The bonding step includes the curing of NCF 22 and the reflowing of solder regions 32 and 308. In the resulting structure (FIG. 13), the portion of NCF 22 between package components 100 and 200 has the function of an underfill, and the portion of NCF 22 not between package components 100 and 200 has the function of a molding material.

Figure 14:
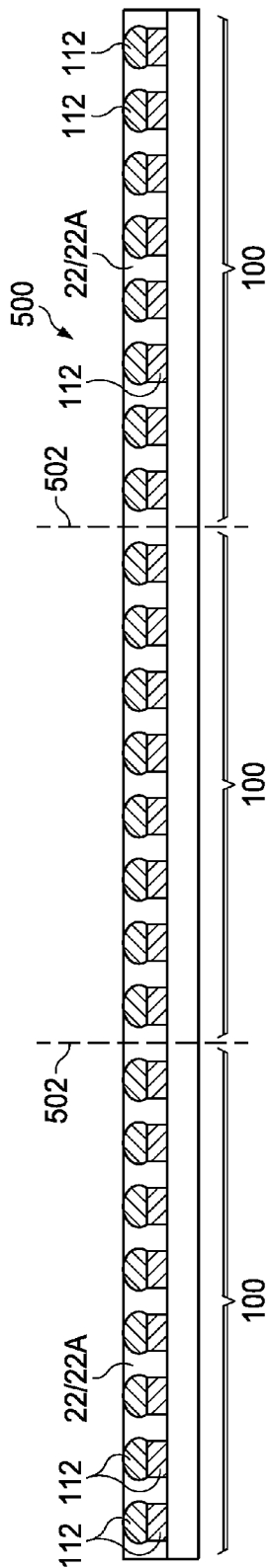

FIGS. 14 through 20 illustrate cross-sectional views of intermediate stages in the formation of a PoP structure in accordance with alternative exemplary embodiments. Referring to FIG. 14, NCF 22 is laminated onto a surface of wafer 500. Wafer 500 includes a plurality of package components 100 therein, which may be device dies. NCF 22 is laminated on the side of wafer 500 that has connectors 112, and connectors 112 penetrate into NCF 22. In some embodiments, the top ends of connectors 112 are substantially level with the top surface of NCF 22. In alternative embodiments, NCF 22 is thick, and connectors 112 are fully buried in NCF 22. After the laminating of NCF 22 onto wafer 500, wafer 500 and NCF 22 are diced into a plurality of pieces along lines 502. Each of the resulting pieces includes one of package components 100 and a piece of NCF 22, which is referred to as NCF 22A hereinafter.

Figure 15:
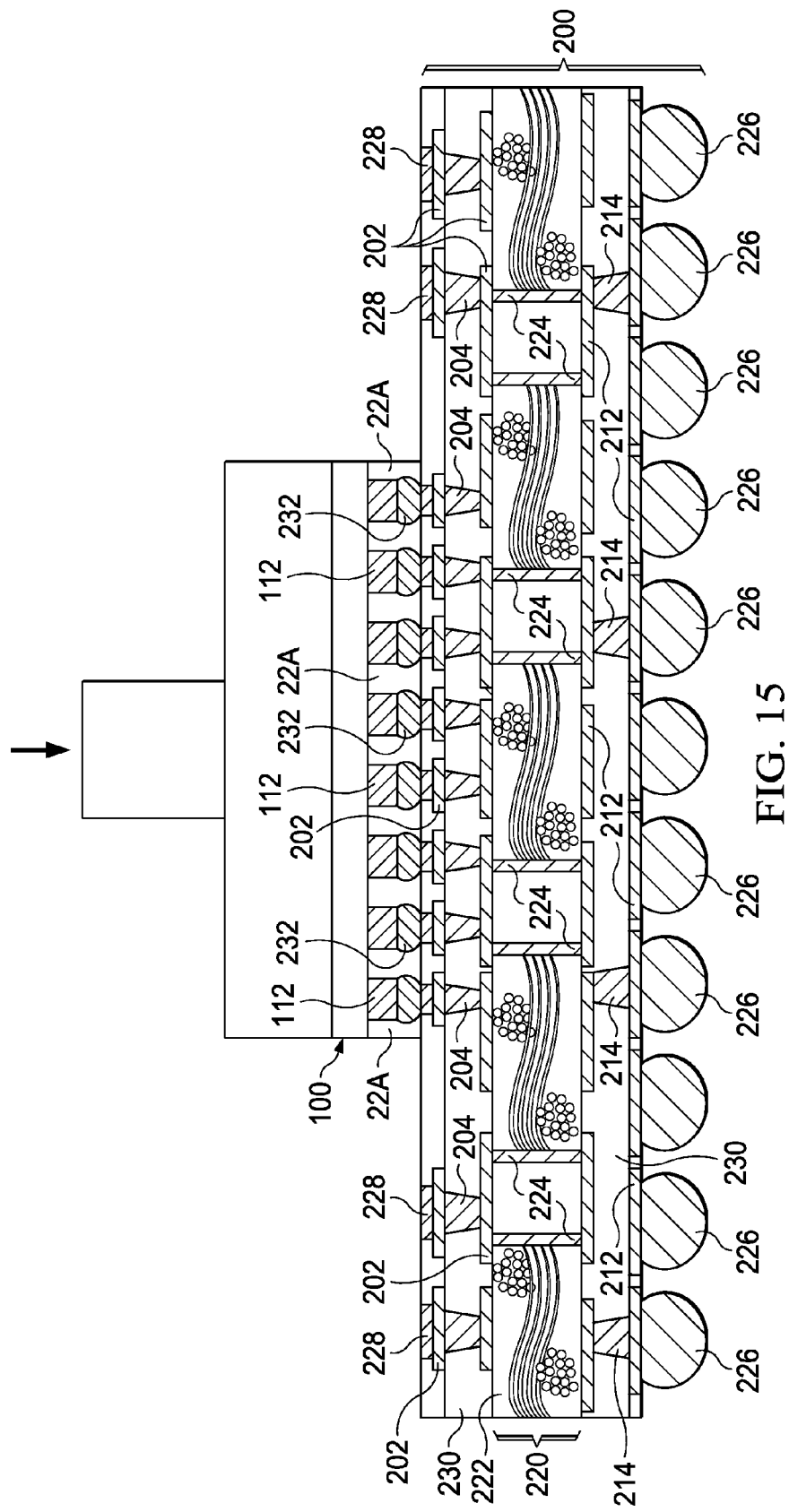

Next, as shown in FIG. 15, one of the pieces formed in the step shown in FIG. 14 is bonded to package component 200, for example, through TCB. NCF 22A is between package components 100 and 200, and hence is in the place of an underfill. Since NCF 22A is soft, it may be squeezed aside from under package component 100, and an exemplary profile of NCF 22 is illustrated in FIG. 16.

Figure 16:
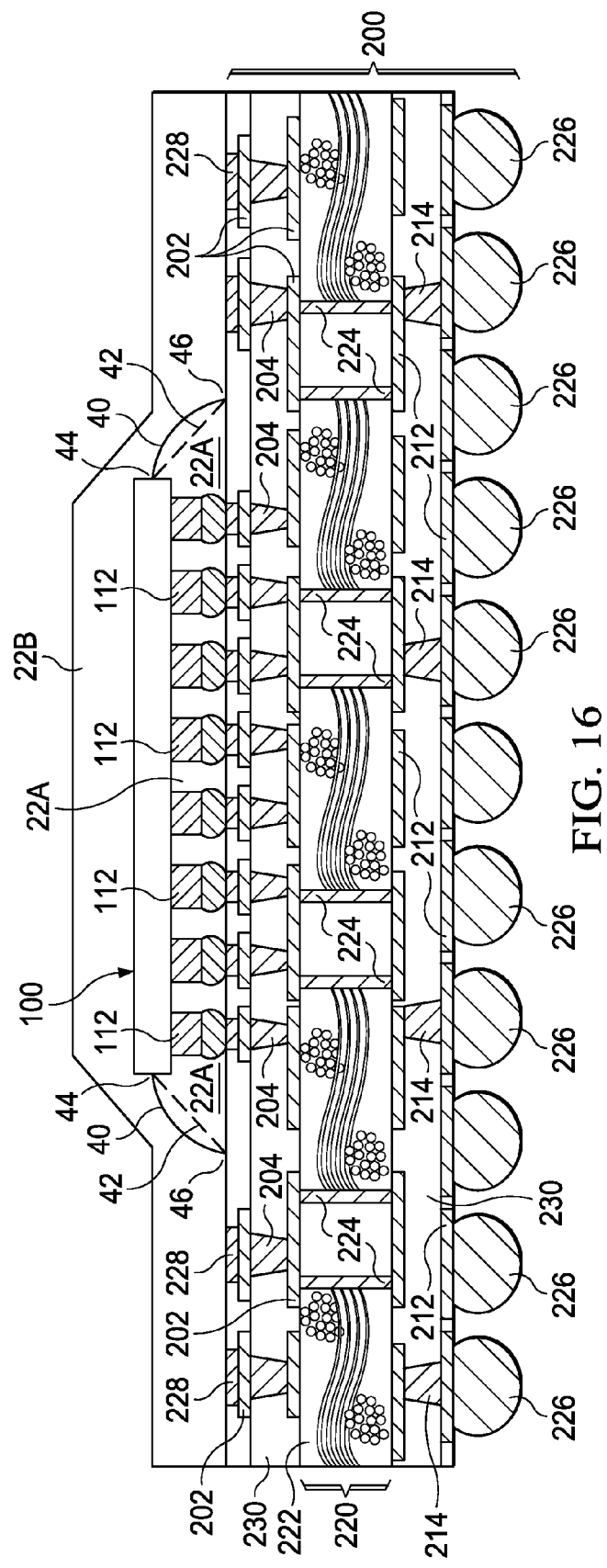

Referring to FIG. 16, an additional NCF 22, which is referred to as NCF 22B hereinafter, is laminated on package components 100 and 200. NCF 22A and NCF 22B may be formed of a same material. Alternatively, NCF 22A and NCF 22B may be formed of different materials. Regardless of whether the materials of NCFs 22A and 22B are the same, NCFs 22A and 22B may be in contact with each other to form distinguishable interfaces 40. It is noted that interfaces 40 have convex profiles. For example, if straight lines 42 are drawn connecting the joining points 44 and 46, interfaces 40 will be on the outer sides (upper sides) of the respective straight lines 42. Points 44 are the joining points of interfaces 40 and package component 100, and points 46 are the joining points of interfaces 40 and package component 200. The profile of interfaces 40 is different from the conventional profiles of the interfaces between underfills and molding compounds that are used in the conventional die-to-substrate bonding structure, because the conventional interfaces have concave profiles.

Figure 17:
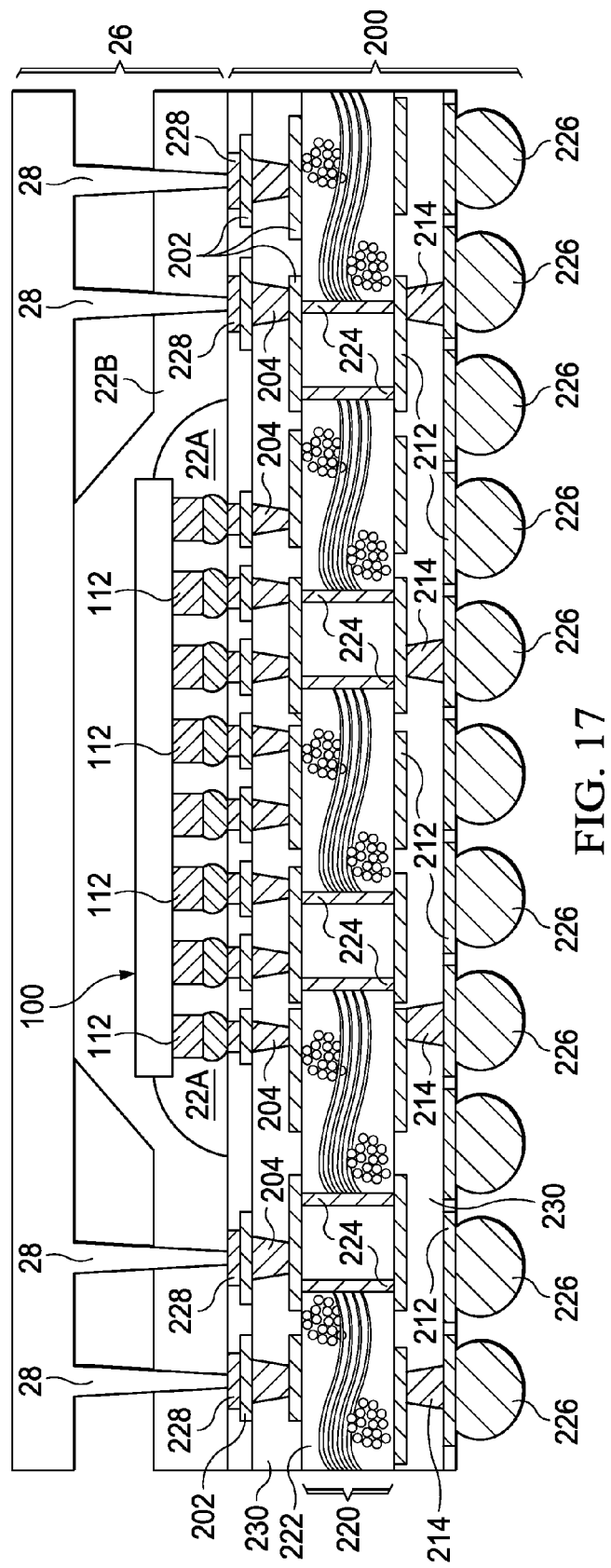
Figure 18:
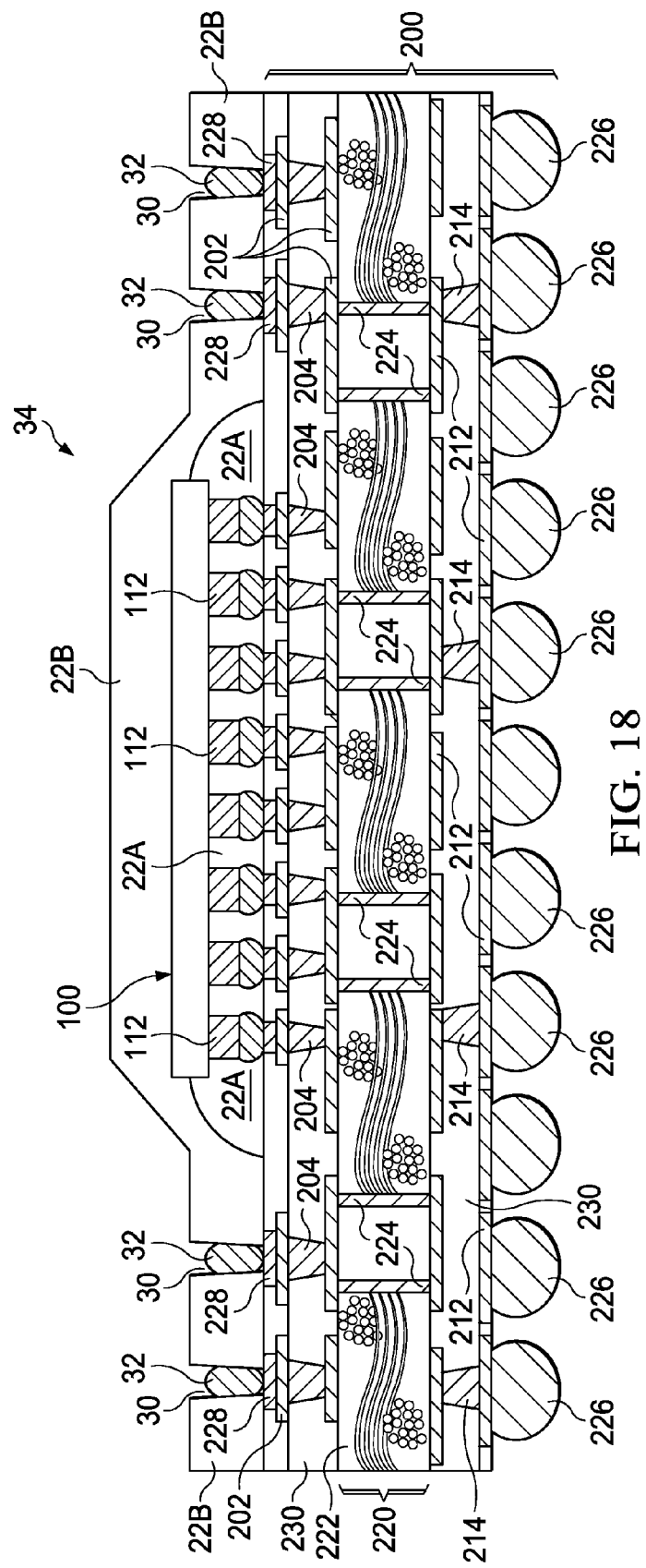
Figure 19:
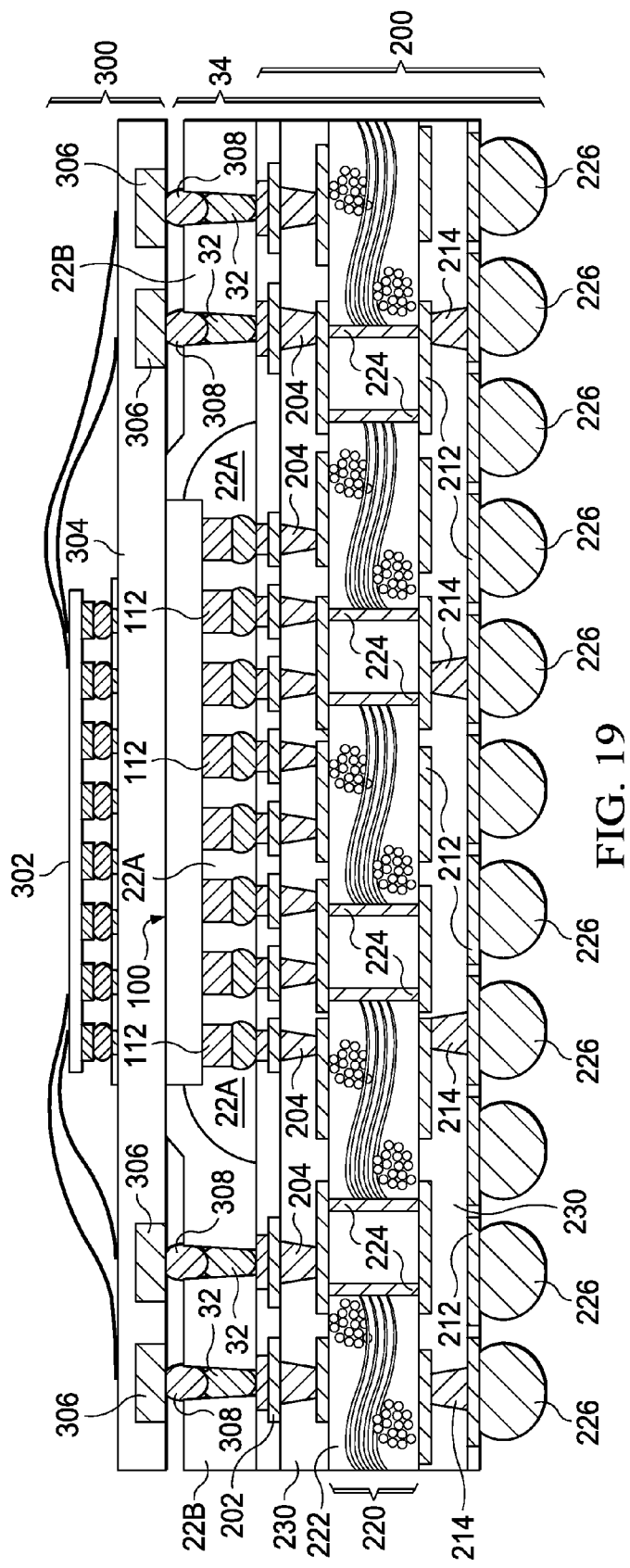
Figure 20:
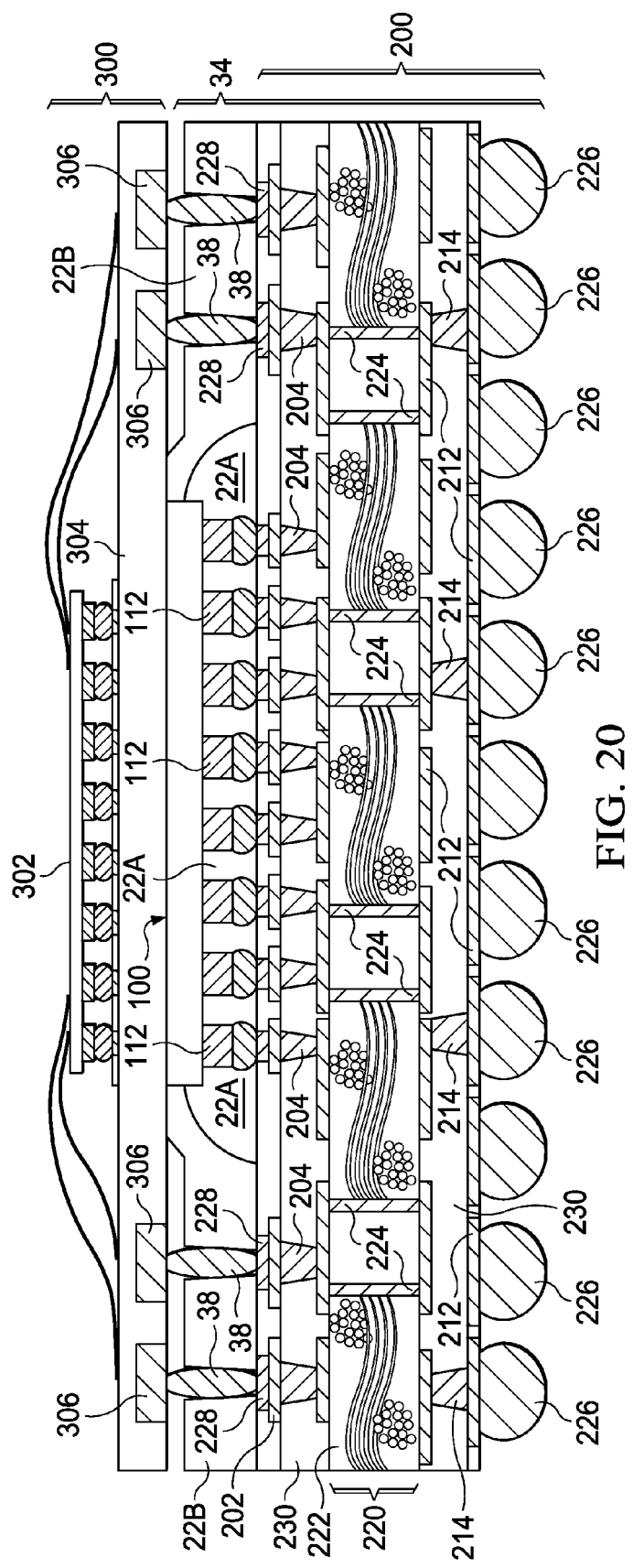

Next, as shown in FIG. 17, an imprint is made by forcing mold tool 26 into NCF 22B. As a result, as shown in FIG. 18, openings 30 are formed, and connectors 228 are exposed through openings 30. As further illustrated in FIG. 18, solder balls 32 are placed into openings 30, and are reflowed. The formation of bottom package 34 is thus finished. FIGS. 19 and 20 illustrate the bonding of top package 300 to bottom package 34. The bonding process includes the curing of NCFs 22A and 22B, and the reflowing of solder regions 32 and 308 to form solder regions 38. In the resulting structure, NCF 22A acts as an underfill, and NCF 22B acts as a molding material.

In the embodiments, through the use of the NCF and the imprint process, very small openings 30 (FIGS. 4, 11, and 18) may be formed. Accordingly, the total number of connections between the top package and the bottom package is increased. The increase in the total number of connections does not require the size of the respective package to be increased. The form factor is thus increased.

In accordance with embodiments, a method includes laminating an NCF over a first package component, and bonding a second package component on the first package component. The NCF and the second package component are on the same side of the first package component. Pillars of a mold tool are then forced into the NCF to form openings in the NCF. The connectors of the first package component are exposed through the openings.

In accordance with other embodiments, a method includes laminating a first NCF on one of a package substrate and a device die, and bonding the device die onto the package substrate. The first NCF is between the package substrate and the device die. A plurality of connectors penetrates through the first NCF to bond the package substrate and the device die. Pillars of a mold tool are forced into a second NCF on a surface of the package substrate to form openings in the second NCF. The connectors of the package substrate are exposed through the openings. A top package is then bonded to the package substrate, wherein solder regions are disposed in the openings to join the top package to the package substrate.

In accordance with yet other embodiments, a device includes a first package component having a plurality of connectors on a top surface, a second package component over and bonded to the top surface of the first package component, and an NCF adjoining the top surface of the first package component. The NCF includes a plurality of openings. A plurality of solder regions is disposed in the plurality of openings and in contact with the plurality of connectors.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
laminating a Non-Conductive Film (NCF) over a first package component, wherein the NCF comprises a polymer and a filler in the polymer, and wherein the first package component comprises a plurality of metal traces, and a first plurality of electrical connectors connected to the plurality of metal traces;
bonding a second package component on the first package component, wherein the second package component comprises a second plurality of electrical connectors bonded to the first plurality of electrical connectors through solder bonding, wherein the NCF and the second package component are on a same side of the first package component; and
after the laminating the NCF, forcing pillars of a mold tool into the NCF to form openings in the NCF, wherein connectors of the first package component are exposed through the openings.

2. The method of claim 1 further comprising:
placing solder balls into the openings; and
reflowing the solder balls to form solder regions on the connectors.

3. The method of claim 1 further comprising bonding a top package to the first package component, wherein the top package is bonded to the first package component through solder regions in the openings.

4. The method of claim 1, wherein the step of laminating the NCF over the first package component is performed before the step of bonding the second package component on the first package component.

5. The method of claim 1, wherein the step of laminating the NCF over the first package component is performed after the step of bonding the second package component on the first package component.

6. The method of claim 5, wherein the NCF is laminated over the first package component and the second package component, and wherein the method further comprises:
laminating an additional NCF film on a wafer; and
sawing the wafer and the additional NCF film into a plurality of pieces, wherein one of the plurality of pieces comprises a piece of the additional NCF and the second package component, wherein after the step of bonding the second package component on the first package component, the pieces of the additional NCF is located between the first and the second package components.

7. The method of claim 1 further comprising, after the step of forcing the pillars of the mold tool into the NCF, curing the NCF.

8. A method comprising:
laminating a first Non-Conductive Film (NCF) on one of a package substrate and a device die, wherein each of the package substrate and the device die comprises a plurality of electrical connectors, wherein the package substrate comprises a plurality metal traces connected to the plurality of electrical connectors in the package substrate, and wherein the NCF comprises a polymer and a filler in the polymer;
bonding the device die onto the package substrate through solder regions, wherein the first NCF is between the package substrate and the device die, and wherein a plurality of connectors penetrates through the first NCF to bond the package substrate to the device die;

laminating a second NCF that is at a solid state on a surface of the package substrate, wherein the second NCF comprises an additional polymer and an additional filler in the additional polymer;

after the laminating the second NCF, forcing pillars of a mold tool into the second NCF to form openings in the second NCF, wherein connectors of the package substrate are exposed through the openings; and bonding a top package to the package substrate, wherein solder regions are disposed in the openings to join the top package to the package substrate.

9. The method of claim 8, wherein the first NCF and the second NCF are portions of a continuous NCF, and wherein the continuous NCF is laminated on the package substrate before the step of bonding the device die onto the package substrate.

10. The method of claim 8, wherein the first NCF and the second NCF are separate NCFs, wherein the first NCF is laminated on the device die before the step of bonding the device die onto the package substrate, and wherein the laminating the second NCF is performed after the step of bonding the device die onto the package substrate.

11. The method of claim 10 comprising:

laminating an additional NCF on a wafer; and before the step of bonding the device die onto the package substrate, sawing the wafer and the additional NCF into a plurality of pieces, wherein one of the plurality of pieces comprises the device die and the first NCF.

12. The method of claim 8, wherein the first NCF comprises a flux, with the filler in the first NCF comprising a silicon filler.

13. The method of claim 8 further comprising, after the step of bonding the top package to the package substrate, curing the first and the second NCFs.

14. The method of claim 1, wherein the forcing the pillars of the mold tool into the NCF is performed by forcing the pillars into the NCF that is at a solid state, until the pillars are in contact with the connectors of the first package component.

\* \* \* \* \*